(12) United States Patent
Nobusa et al.

(10) Patent No.: US 11,233,163 B2
(45) Date of Patent: Jan. 25, 2022

(54) PHOTO DETECTION ELEMENT, PHOTO DETECTOR, PHOTO DETECTION SYSTEM, LIDAR DEVICE AND VEHICLE COMPRISING A PLURALITY OF STRUCTURE BODIES SEPARATELY PROVIDED BETWEEN FIRST AND SECOND REGIONS

(71) Applicant: Kabushiki Kaisha Toshiba, Minato-ku (JP)

(72) Inventors: Yuki Nobusa, Yokohama (JP); Ikuo Fujiwara, Yokohama (JP); Kazuhiro Suzuki, Meguro (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 512 days.

(21) Appl. No.: 16/293,696

(22) Filed: Mar. 6, 2019

(65) Prior Publication Data
US 2020/0091360 A1 Mar. 19, 2020

(30) Foreign Application Priority Data
Sep. 19, 2018 (JP) .............................. JP2018-175272

(51) Int. Cl.
*G01S 17/894* (2020.01)
*H01L 31/0352* (2006.01)
(Continued)

(52) U.S. Cl.
CPC .... *H01L 31/035272* (2013.01); *G01S 7/4816* (2013.01); *G01S 17/931* (2020.01);
(Continued)

(58) Field of Classification Search
CPC ........... H01L 29/0634; H01L 29/42376; H01L 23/528; H01L 27/1203; H01L 29/0619;
(Continued)

(56) References Cited

U.S. PATENT DOCUMENTS 8,901,652 B2 * 12/2014 Saggio ................ H01L 29/7802
257/341
2010/0148040 A1  6/2010 Sanfilippo et al.
2012/0248295 A1 10/2012 Ito et al.

FOREIGN PATENT DOCUMENTS

JP      6-224463    8/1994
JP    2009-105489   5/2009
(Continued)

OTHER PUBLICATIONS

Japanese Office Action dated Mar. 5, 2021 in Japanese Patent Application No. 2018-175272, 5 pages.

*Primary Examiner* — Que Tan Le
(74) *Attorney, Agent, or Firm* — Oblon, McClelland, Maier & Neustadt, L.L.P.

(57) ABSTRACT

In one embodiment, a photo detection element includes a first region of a first conductivity type, a second region of a second conductivity type, a third region of the first conductivity type provided between the second region and the first region, and a plurality of structure bodies of the first conductivity type which are provided between the first region and the third region separately in a second direction crossing with a first direction from the third region toward the second region.

22 Claims, 21 Drawing Sheets

(51) Int. Cl.
  *H01L 27/144* (2006.01)
  *H01L 31/18* (2006.01)
  *G01S 7/481* (2006.01)
  *H01L 31/107* (2006.01)
  *G01S 17/931* (2020.01)

(52) U.S. Cl.
  CPC ........ *H01L 27/1443* (2013.01); *H01L 31/107*
       (2013.01); *H01L 31/1804* (2013.01)

(58) Field of Classification Search
  CPC ......... H01L 27/0207; H01L 21/823481; H01L
       27/1443; H01L 27/1461; H01L 27/1463;
       H01L 31/035272; H01L 31/107; G01S
       17/894; G01S 17/931; G01S 7/4863
  USPC .................................. 250/239, 214.1, 208.1
  See application file for complete search history.

(56) References Cited

FOREIGN PATENT DOCUMENTS

| | | |
|---|---|---|
| JP | 2009-260160 A | 11/2009 |
| JP | 2011-71455 A | 4/2011 |
| JP | 2011-204879 | 10/2011 |
| JP | 2013-16638 | 1/2013 |
| JP | 2014-59301 A | 4/2014 |
| JP | 2017-32359 A | 2/2017 |

\* cited by examiner

PHOTO DETECTION ELEMENT, PHOTO DETECTOR, PHOTO DETECTION SYSTEM, LIDAR DEVICE AND VEHICLE COMPRISING A PLURALITY OF STRUCTURE BODIES SEPARATELY PROVIDED BETWEEN FIRST AND SECOND REGIONS

CROSS-REFERENCE TO RELATED APPLICATION

This application is based upon and claims the benefit of priority from the prior Japanese Patent Application No. 2018-175272, filed on Sep. 19, 2018, the entire contents of which are incorporated herein by reference.

FIELD

Embodiments described herein relate generally to a photo detection element, a photo detector, a photo detection system, a lidar device and a vehicle.

BACKGROUND

Improvement of photon detection efficiency is desired as a photo detection element.

DETAILED DESCRIPTION

According to one embodiment, a photo detection element includes a first region of a first conductivity type, a second region of a second conductivity type, a third region of the first conductivity type provided between the second region and the first region, and a plurality of structure bodies of the first conductivity type which are provided between the first region and the third region separately in a second direction crossing with a first direction from the third region toward the second region.

Hereinafter, further embodiments will be described with reference to the drawings. Ones with the same symbols show the corresponding ones. In addition, the drawings are schematic or conceptual, and accordingly, the relation between a thickness and a width in each portion, and a ratio of sizes between portions are not necessarily identical to those of the actual ones. In addition, even when the same portions are shown, the dimensions and the ratio thereof may be shown differently depending on the drawings.

First Embodiment

Figure 1A:
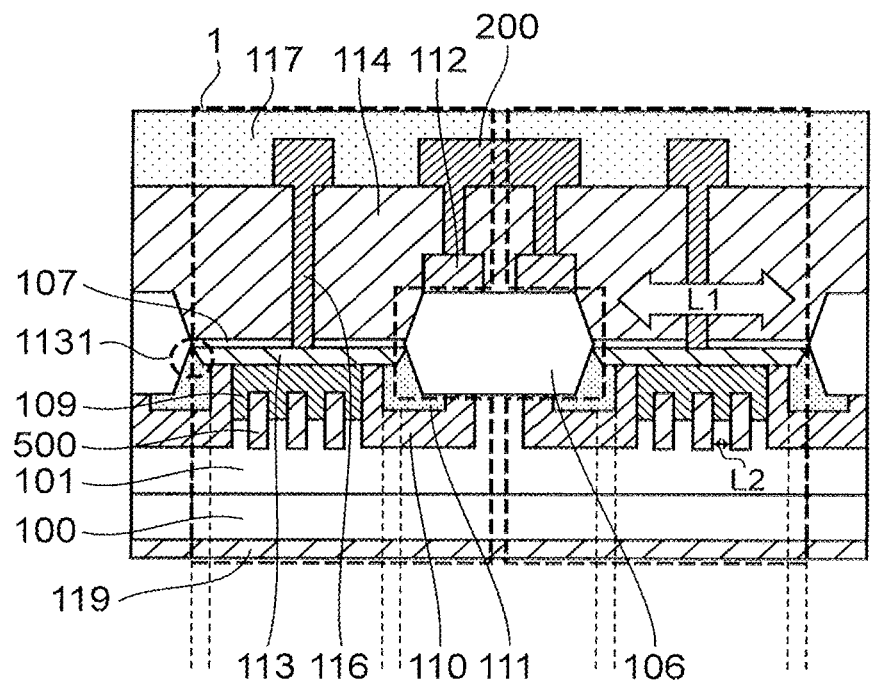
FIGS. 1A, 1B are diagrams showing a photo detector including a photo detection element according to a first embodiment.
Figure 1B:
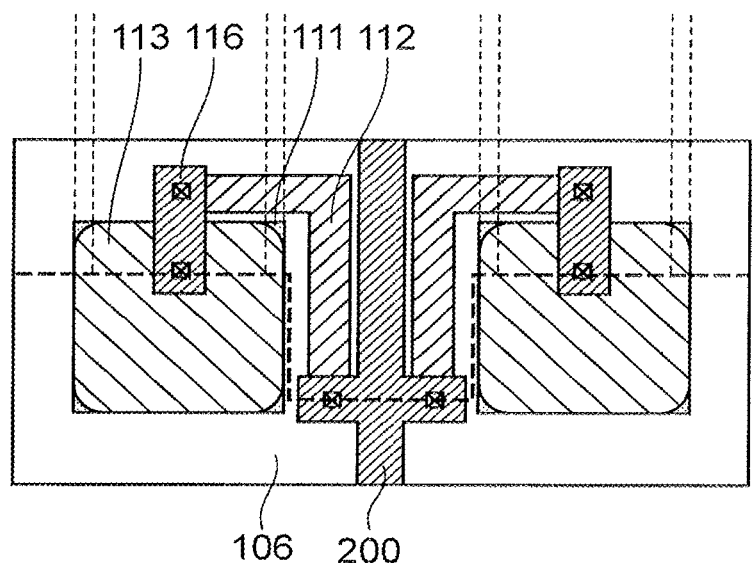

FIGS. 1A, 1B are respectively a sectional view and a top view of a photo detector including a photo detection element 1 according to a first embodiment. FIG. 1A is a sectional view of a dotted line of FIG. 1B.

As shown in FIGS. 1A, 1B, the photo detector according to the first embodiment includes a plurality of the photo detection elements 1 according to the first embodiment and an element isolation structure 106 provided among a plurality of the photo detection elements 1.

The photo detection element 1 according to the first embodiment includes a silicon substrate 101 of a first conductivity type (also called a p-type silicon epilayer, a first region), a second region 113 of a second conductivity type (also called an n-type layer), a third region 109 of the first conductivity type (also called a p-type layer) provided between the second region 113 and the silicon substrate 101, and a plurality of structure bodies 500 of the first conductivity type (also called a sixth region) which are provided between the silicon substrate 101 and the third region 109 separately at intervals of the same level in a second direction crossing with a first direction. Here, the first direction of the embodiment indicates a direction from the p-type layer 109 toward the n-type layer 113. "To cross with" in the embodiment indicates "to be approximately orthogonal to". Regarding "the same level" in the embodiment, ±5% shall be a range of the same level.

The photo detection element 1 according to the first embodiment includes a pn junction diode which is formed between the third region 109 and the second region 113, and incident light incident from above the second region 113 is subjected to photoelectric conversion in the silicon substrate 101, for example, and the carriers are subjected to avalanche multiplication in a high electric field region near the pn junction. At this time, a voltage required for causing avalanche multiplication is called a breakdown voltage. When a reverse bias not less than the breakdown voltage is applied to the photo detection element 1, the photo detection element 1 is caused to operate. This operation is called a Geiger mode operation. A wavelength band of the incident light is not less than 700 nm and not more than 1500 nm, for example.

Further, as shown in FIGS. 1A, 1B, the photo detection element 1 according to the first embodiment includes a fourth region 111 of the second conductivity type (also called an n-type guard ring layer) provided so as to surround the periphery of the second region 113 in the second direction crossing with the first direction from the silicon substrate 101 toward the second region 113, a fifth region 110 of the first conductivity type (also called a p-type guard ring layer) provided between the silicon substrate 101 and the fourth region 111, a back surface electrode 119 provided for applying a reverse bias not less than the breakdown voltage, a first electrode 116 which is electrically connected to the second region 113 and is provided for applying a reverse bias not less than the breakdown voltage, a quench resistor 112 which is electrically connected to the first electrode 116 and is provided so as to converge the carriers by the voltage drop, a single crystal silicon substrate (also called a single crystal p-type silicon substrate) 100 provided between the back surface electrode 119 and the silicon substrate 101, an insulating layer 114 provided for separating and insulating the single crystal silicon substrate 100, the quench resistor 112 and the first electrode 116, a silicon oxide film 107 provided between the insulating layer 114 and the second region 113 for suppressing a dark current, a second electrode 200 which is electrically connected to the quench resistor 112 and a reading pad, and a passivation film 117 to protect the first electrode 116 and the second electrode 200.

The sixth region 500 is formed by ion implantation of boron between the silicon substrate 101 and the third region 109 under the condition of the same level as the p-type guard ring layer 110. It is preferable that a clearance L2 between the sixth regions 500 is not more than 30% of a width L1 of the photo detection element 1 in the second direction. By this means, flow easiness of the carriers between the sixth regions 500 is changed, and thereby the electric field strength is increased. It is not desirable that the clearance L2 of the sixth regions 500 is larger than 30% of the width L1 of the photo detection element 1 in the second direction, because increase of the electric field strength is small. In addition, it is preferable to provide a curvature at each of the four corners of the pattern of the sixth region 500 so as to avoid electric field concentration.

Figure 2A:
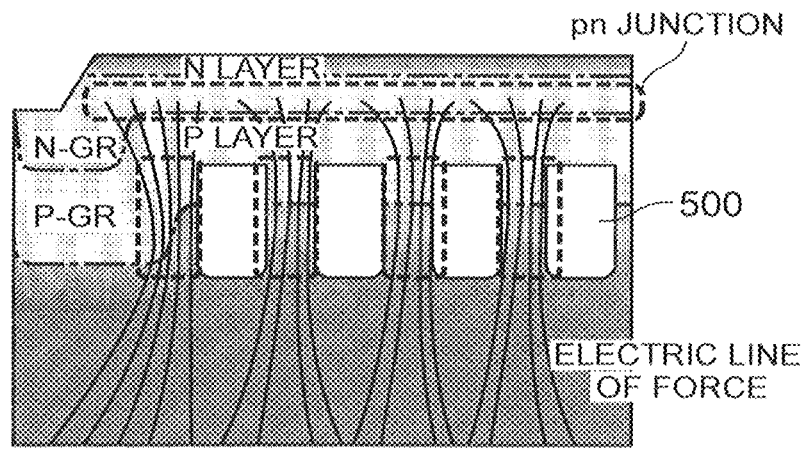
FIGS. 2A to 2C are diagrams showing electric lines of force in the silicon substrate.
Figure 2B:
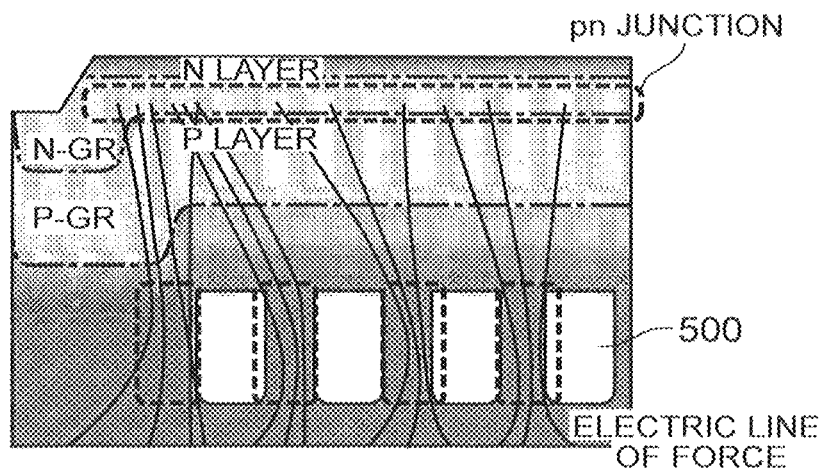
Figure 2C:
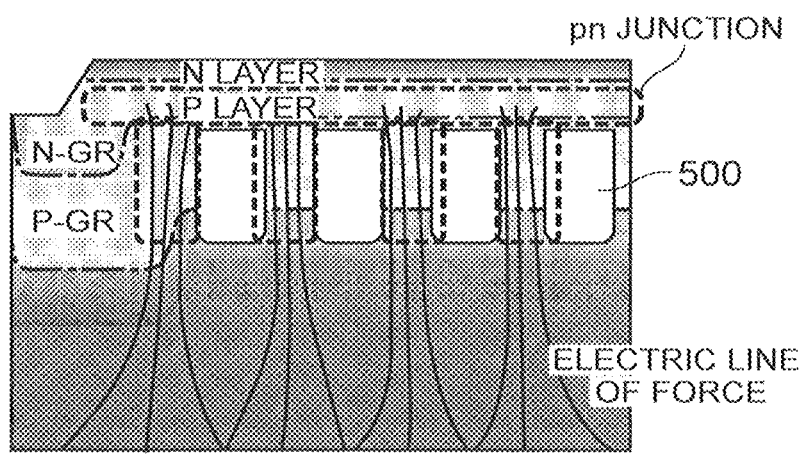

FIGS. 2A to 2C are diagrams each showing electric lines of force in the silicon substrate 101 including the sixth regions 500. The sixth regions 500 are provided as shown in FIG. 2A, and thereby uniformity of the electric field in the region formed by the pn junction in which avalanche is caused. In addition, the electric field in the region between the sixth regions 500 becomes high, and this leads to reduction of jitter. Jitter means fluctuation of a signal in the time axis direction. It is preferable that a depth of peak impurity concentration of the sixth region 500 is not more than 3 μm from the pn junction in the first direction. When the sixth regions 500 exist at a position deeper than 3 μm from the pn junction in the first direction, charges are diffused as shown in FIG. 2B, and thereby the electric field concentrates at the end portion of the pn junction, and uniformity of the electric field is lost. On the other hand, when the sixth regions 500 exist at a position not more than 3 μm from the pn junction in the first direction, since charges are not diffused as shown in FIG. 2C, it is possible to suppress that the electric field concentrates at the end portion of the pn junction, but since the charges are not diffused, the region in which avalanche is caused is reduced, and thereby the photon detection efficiency is decreased.

Figure 3:
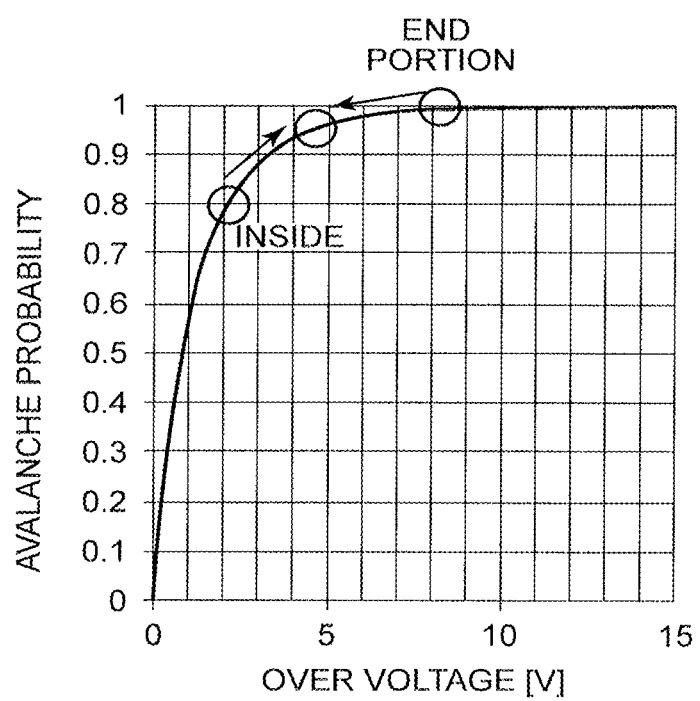
FIG. 3 is a diagram showing the relation between an over voltage and an avalanche probability.

Here, an effect obtained by making the electric field uniform will be described. FIG. 3 is a diagram showing the relation between an over voltage and an avalanche probability. The over voltage is a difference between a breakdown voltage and an operating voltage. In the example of FIG. 3, when the over voltage is between 0 V and 4 V, the avalanche probability rapidly rises, when the over voltage is between 4 V and 7 V, the rise of the avalanche probability becomes gradual, and when the over voltage becomes larger than 7 V, the avalanche probability becomes about 1 and constant. Regarding a general photo detection element, a characteristic is known in which the electric field concentrates at the end portion of the pn junction, and the electric field is hardly applied to the inside of the pn junction, and accordingly, the electric field becomes nonuniform seen from the whole of the pn junction. For example, when it is supposed that the over voltage is 8 V at the end portion of the pn junction because the electric field concentrates at the end portion, and the over voltage is 3 V at the inside of the pn junction because the electric field is hardly applied thereto, the avalanche probability at the end portion of the pn junction is about 1, and the avalanche probability inside the pn junction is about 0.8.

In the case of the above-described example, since a ratio of the end portion is small seen from the whole of the pn junction, an average avalanche probability in the whole of the pn junction becomes a value approximate to the avalanche probability inside the pn junction. On the other hand, the electric field applied to the pn junction is made uniform, and thereby the avalanche probability at the end portion of the pn junction drops, but the avalanche probability inside the pn junction increases. Since a ratio of the inside is large seen from the whole of the pn junction, the average avalanche probability in the whole of the pn junction becomes larger than the case in which the electric field is nonuniform. Since the average avalanche probability in the whole of the pn junction contributes to the photon detection efficiency, when the avalanche probability is increased, the photon detection efficiency is increased.

The single crystal p-type silicon substrate 100 is doped with boron at a concentration of $4E18/cm^3$ ($4.0\times10^{18}/cm^3$), for example.

The p-type silicon epilayer 101 is deposited by epitaxial growth on the single crystal p-type silicon substrate 100 while being doped with boron at a concentration of $1E15/cm^3$ ($1.0\times10^{15}/cm^3$). A thickness of the p-type silicon epilayer 101 is about 10 µm, for example.

The n-type layer 113 is formed by ion implantation of phosphorus into the p-type layer 109, for example. In addition, it is preferable to provide a curvature at each of four corners of the pattern of the n-type layer 113 so as to avoid electric field concentration.

The p-type layer 109 is formed by ion implantation of boron into the p-type silicon epilayer 101, for example. In addition, it is preferable to provide a curvature at each of four corners of the pattern of the p-type layer 109 so as to avoid electric field concentration.

The p-type guard ring layer 110 is formed by ion implantation of boron into the p-type silicon epilayer 101 around the p-type layer 109, for example. In order to form a barrier to the electrons contributing to the avalanche at the p-type layer 109 side, it is preferable that a peak concentration of the p-type guard ring layer 110 is higher than the p-type layer 109. In addition, the p-type layer 109 is sufficiently surrounded by the p-type guard ring layer 110, and thereby the effect of the barrier can be enhanced, and accordingly, it is preferable that a depth of a peak impurity concentration of the p-type guard ring layer 110 is formed deeper than the p-type layer 109 in the first direction. In addition, it is preferable that the p-type guard ring layer 110 connects to the p-type layer 109, and is formed so as to include the n-type guard ring layer 111. This is because electric lines of force from an edge 1131 of the n-type layer 113 are dammed by the p-type guard ring layer 110, and thereby the carriers generated deeply in the p-type silicon epilayer 101 are induced to the pn junction for causing avalanche multiplication. In addition, it is preferable to provide a curvature at each of four corners of the pattern of the p-type guard ring layer 110 so as to avoid electric field concentration.

Further, as shown in FIG. 1A, at least a part of the p-type guard ring layer 110 is provided between the p-type layer 109 and the n-type guard ring layer 111. In addition to the improvement of the uniformity of the electric field by the sixth regions 500, when the p-type guard ring layer 110 is provided, the uniformity of the electric field is further improved.

The n-type guard ring layer 111 is formed by ion implantation of phosphorus into the p-type guard ring layer 110 so as to surround the periphery of the n-type layer 113. It is preferable that the n-type guard ring layer 111 covers at least a part of a bird-beak in which many stress defects existing in the element isolation structure 106 exist, and has a depth of the same level as or deeper than the element isolation structure 106. By this means, it is possible to suppress an afterpulse resulting from the defect. The afterpulse is a phenomenon in which when a current flows, electrons captured in the defects of the photo detection element 1 are discharged after a definite time, and the electrons cause a secondary current. In addition, it is preferable that the n-type guard ring layer 111 has a lower peak concentration than the n-type layer 113, covers at least a part of the edge 1131 of the n-type layer 113, and has a depth of peak concentration deeper than the n-type layer 113.

By this means, it is possible to relax increase of an electric field strength at the edge 1131 of the n-type layer 113 by covering the edge 1131 with the n-type guard ring layer 111 having a low concentration. A section obtained by cutting the photo detector of the embodiment is measured by a secondary ion mass spectrometry to obtain an impurity concentration profile, and a concentration of an apex of the maximum peak in the concentration profile and a depth at that time are the peak concentration and the depth of peak concentration for the embodiment. In addition, it is preferable to provide a curvature at each of four corners of the pattern of the n-type guard ring layer 111 so as to avoid electric field concentration. In addition to the improvement of the uniformity of the electric field by the sixth regions 500, when the n-type guard ring layer 111 is provided, the uniformity of the electric field is further improved.

Next, a manufacturing method of the photo detector according to the first embodiment will be described.

Figure 4A:
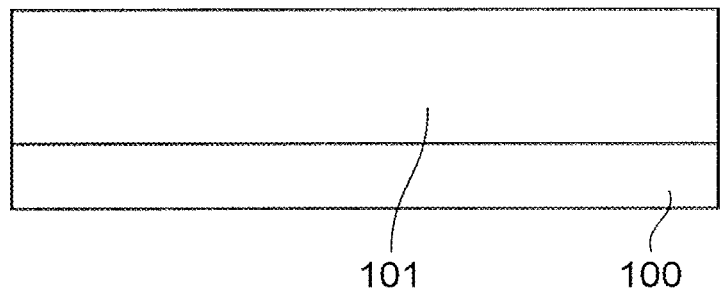
FIGS. 4A, 4B are diagrams showing a manufacturing method of the photo detector including the photo detection element according to the first embodiment.
Figure 4B:
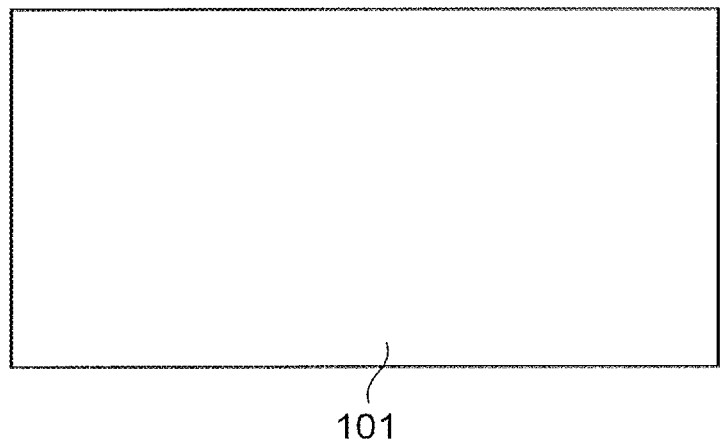

As shown in FIGS. 4A, 4B, for example, a wafer is prepared in which the p-type silicon epilayer 101 doped with boron at a concentration of $1E15/cm^3$ ($1.0\times10^{15}/cm^3$) is epitaxially grown in a thickness of 10 µm on the single crystal p-type silicon substrate 100 doped with boron at a concentration of $4E18/cm^3$ ($4.0\times10^{18}/cm^3$).

Figure 5A:
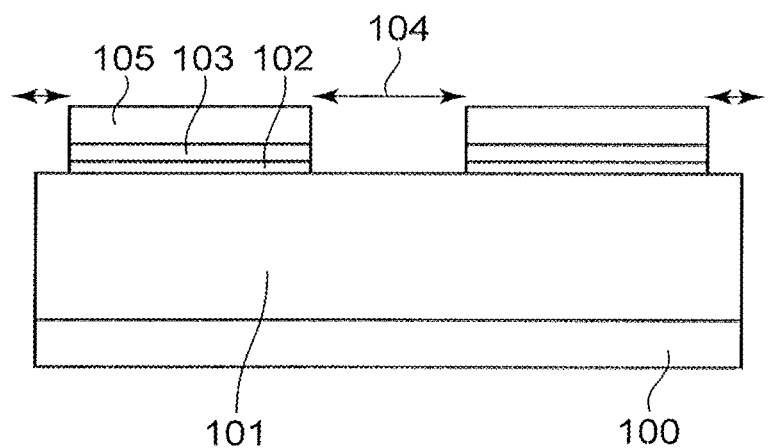
FIGS. 5A, 5B are diagrams showing the manufacturing method of the photo detector including the photo detection element according to the first embodiment.
Figure 5B:
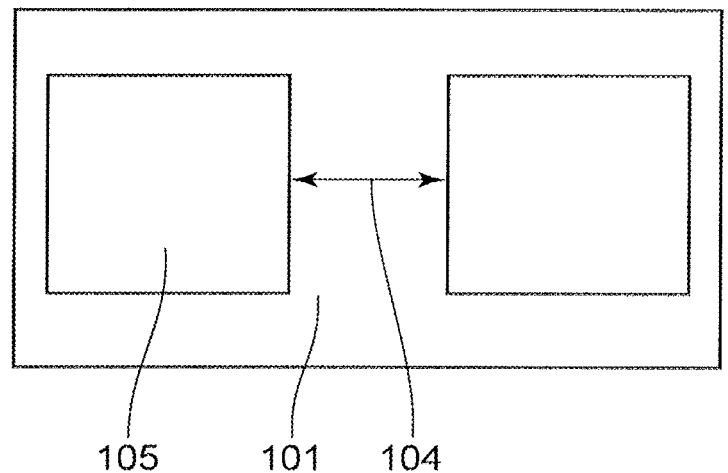

Next, as shown in FIGS. 5A, 5B, for example, a surface of the p-type silicon epilayer 101 is oxidized to deposit a silicon oxide film 102 of a thickness of 100 nm, and then a silicon nitride film 103 is deposited thereon by a Low-Pressure CVD in a thickness of 150 nm. Then a resist 105 to define an element isolation region 104 is pattern-formed by a lithography process, and the silicon nitride film 103 and the silicon oxide film 102 at a resist opening portion are removed by an RIE (Reactive Ion Etching) method.

Figure 6A:
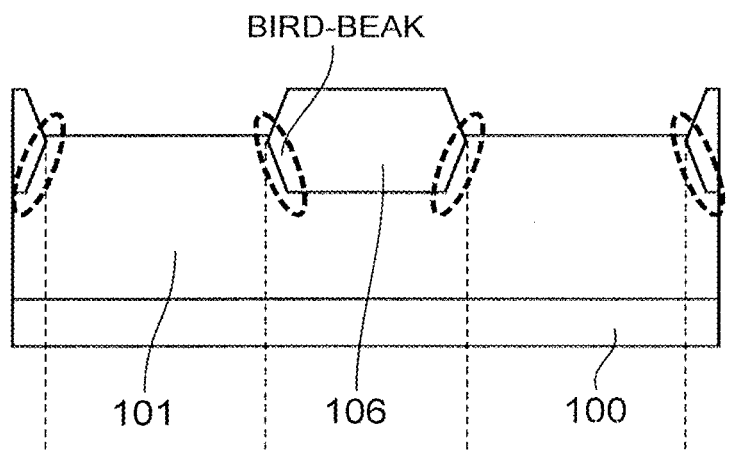
FIGS. 6A, 6B are diagrams showing the manufacturing method of the photo detector including the photo detection element according to the first embodiment.
Figure 6B:
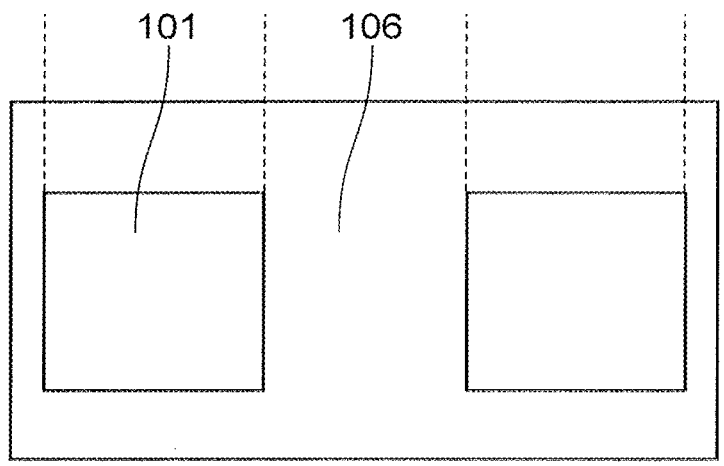

Next, as shown in FIGS. 6A, 6B, for example, the element isolation structure 106 is formed by a LOCOS (Local Oxidation) method on the surface of the p-type silicon epilayer 101 using a normal LSI manufacturing process, and then the silicon nitride film 103 and the silicon oxide film 102 are removed by etching. At this time, an intrusion depth of the element isolation structure 106 into the p-type silicon epilayer 101 side is about 0.4 µm. In addition, a bird-beak is formed on the element isolation structure 106 during the manufacturing process such as an oxidation process, and stress defects are generated therein to induce afterpulses. For the reason, it is necessary to suppress generation of avalanche at the periphery of the bird-beak.

Figure 7A:
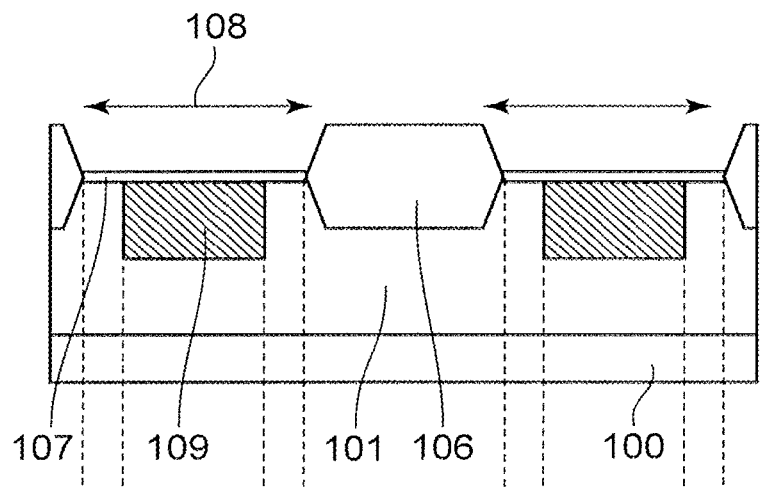
FIGS. 7A, 7B are diagrams showing the manufacturing method of the photo detector including the photo detection element according to the first embodiment.
Figure 7B:
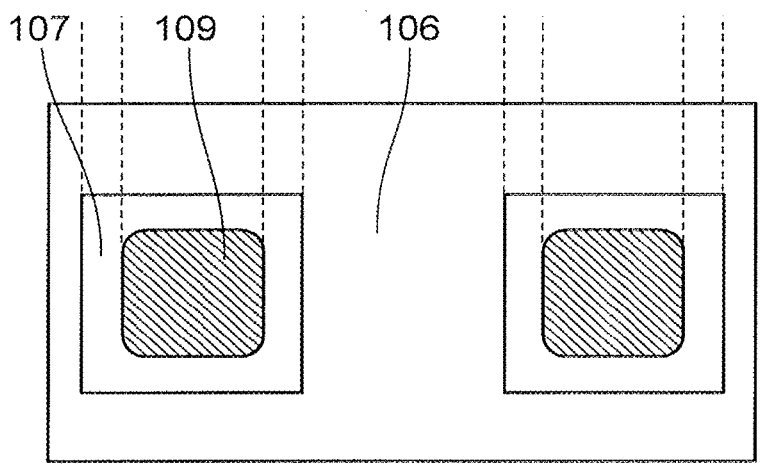

Next, as shown in FIGS. 7A, 7B, the surface of the p-type silicon epilayer 101 is oxidized to deposit a silicon oxide film 107 of a thickness of 50 nm, and then the p-type layer 109 is pattern-formed in an element region 108 by a lithography process and an ion implantation process. In the case of providing a curvature, the pattern is formed using a mask with a curvature at the edge at the time of the ion implantation.

Figure 8A:
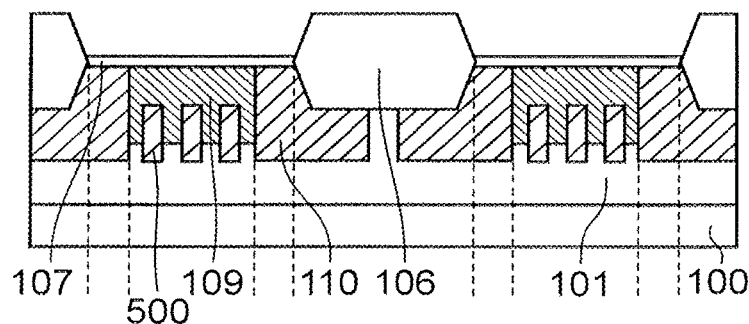
FIGS. 8A to 8C are diagrams showing the manufacturing method of the photo detector including the photo detection element according to the first embodiment.
Figure 8B:
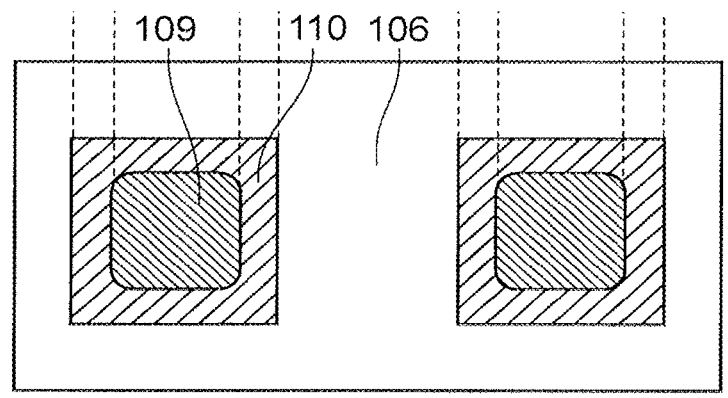
Figure 8C:
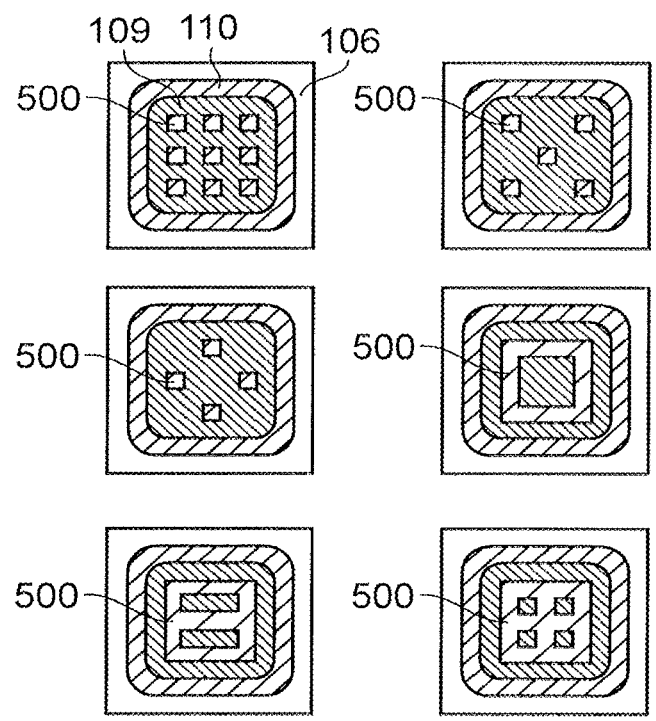

Next, as shown in FIGS. 8A, 8B, each of the p-type guard ring layer 110 and the sixth regions 500 is pattern-formed in the element region 108 by a lithography process and an ion implantation process. For example, the ion implantation for each of the p-type guard ring layer 110 and the sixth regions 500 is performed using boron as the ion implantation species to obtain that a depth of peak concentration and a peak concentration are respectively 1.1 µm and $1E17/cm^3$ ($1.0\times10^{17}/cm^3$). It is preferable that the ion implantation species, the depth of peak concentration and the peak concentration of the p-type guard ring layer 110 are set to be the same level as those of the sixth regions 500, because the processes thereof become simple. Not based on FIG. 8A, the p-type guard ring layer 110 may not be separated below the element isolation structure 106, but may be provided so as to cover the element isolation structure 106. FIG. 8C is a diagram showing pattern examples of the sixth regions 500.

Figure 9A:
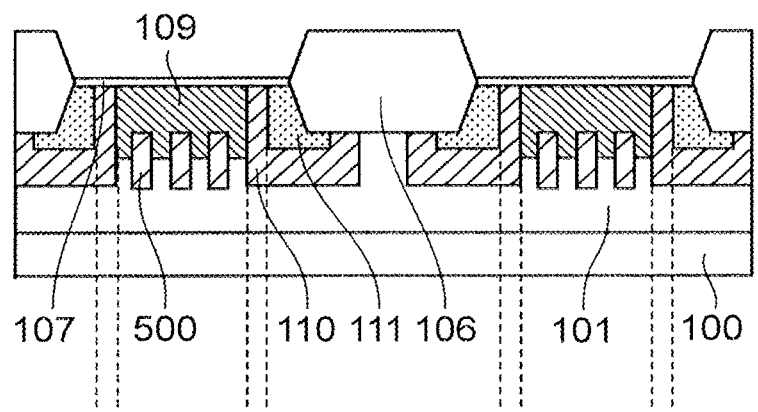
FIGS. 9A, 9B are diagrams showing the manufacturing method of the photo detector including the photo detection element according to the first embodiment.
Figure 9B:
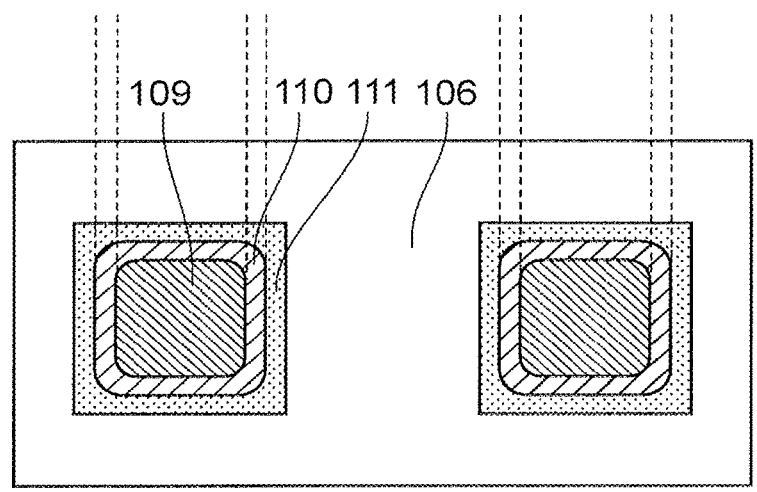

Next, as shown in FIGS. 9A, 9B, the n-type guard ring layer 111 is pattern-formed in the element region 108 by a lithography process and an ion implantation process. For example, the ion implantation is performed using phosphorus as the ion implantation species to obtain that a depth of peak concentration and a peak concentration of the n-type guard ring layer 111 are respectively 0.4 µm and 1E17/cm³ ($1.0 \times 10^{17}$/cm³).

Then, annealing for activating the p-type layer 109, the p-type guard ring layer 110, and the n-type guard ring layer 111 is performed.

Figure 10A:
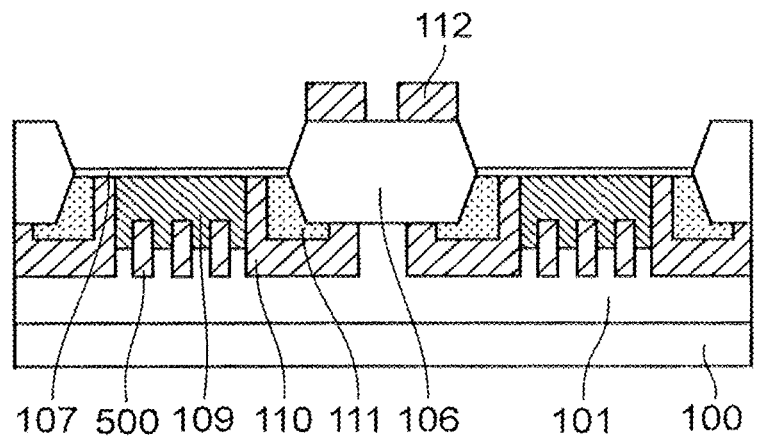
FIGS. 10A, 10B are diagrams showing the manufacturing method of the photo detector including the photo detection element according to the first embodiment.
Figure 10B:
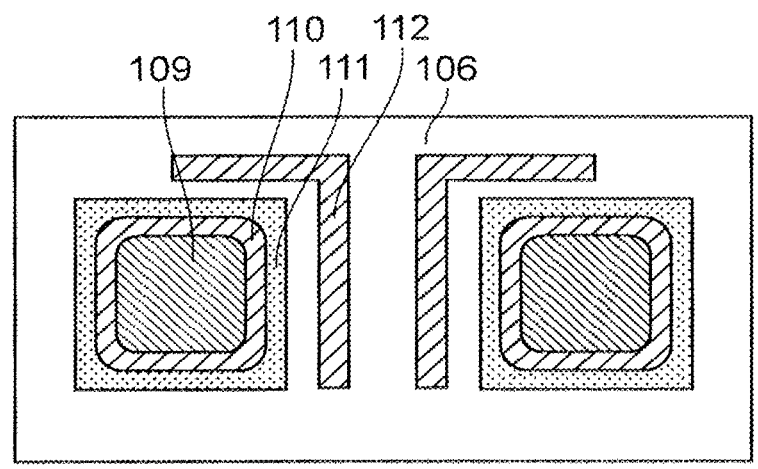

Next, as shown in FIGS. 10A, 10B, for example, a polysilicon film is deposited in a thickness of 0.2 µm by a Low-Pressure CVD, and is processed into a prescribed shape by a lithography process and an RIE process to deposit the quench resistor 112. In order that a prescribed resistance value is obtained as the quench resistor 112, an implantation of boron fluoride is performed into the quench resistor 112 with an acceleration energy of 20 keV and an impurity amount of about 1E15/cm² ($1.0 \times 10^{15}$/cm²), and then an activation annealing is performed.

Figure 11A:
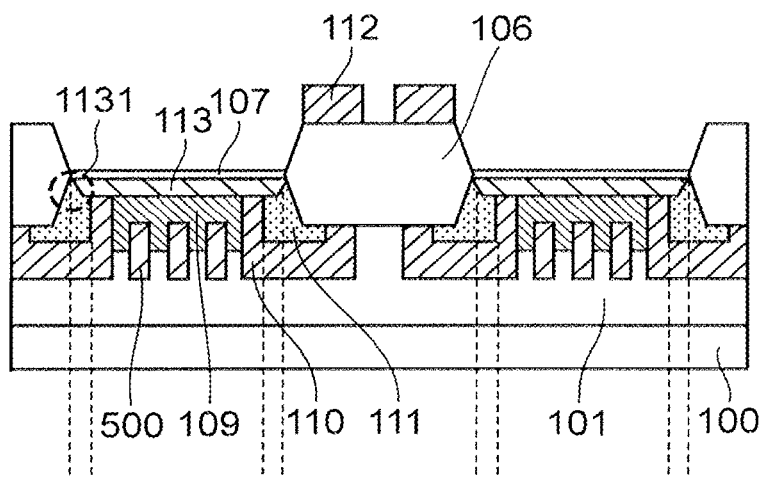
FIGS. 11A, 11B are diagrams showing the manufacturing method of the photo detector including the photo detection element according to the first embodiment.
Figure 11B:
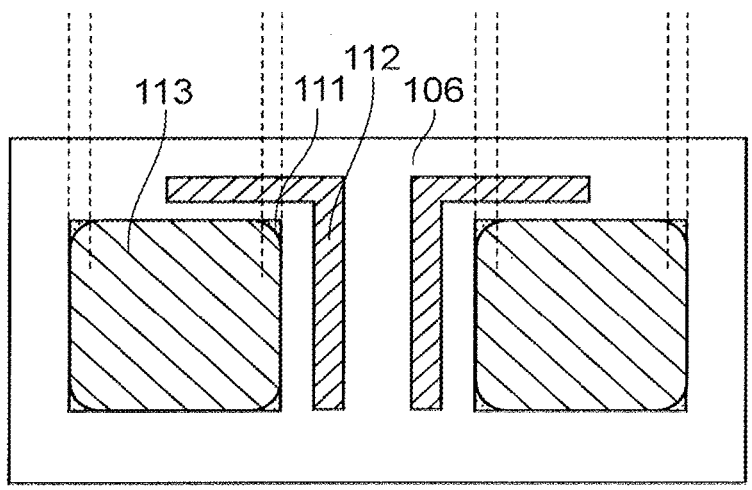

Next, as shown in FIGS. 11A, 11B, the n-type layer 113 doubling as an ohmic electrode portion of a metal electrode and the silicon layer is pattern-formed in the element region 108 by a lithography process and an ion implantation process. For example, the ion implantation is performed using phosphorus as the ion implantation species to obtain that a depth of peak concentration and a peak concentration of the n-type layer 113 are respectively 0.2 µm and 1.5e20/cm³ ($1.5 \times 10^{20}$/cm³). Then, a rapid thermal anneal for activating the n-type layer 113 is performed.

Figure 12A:
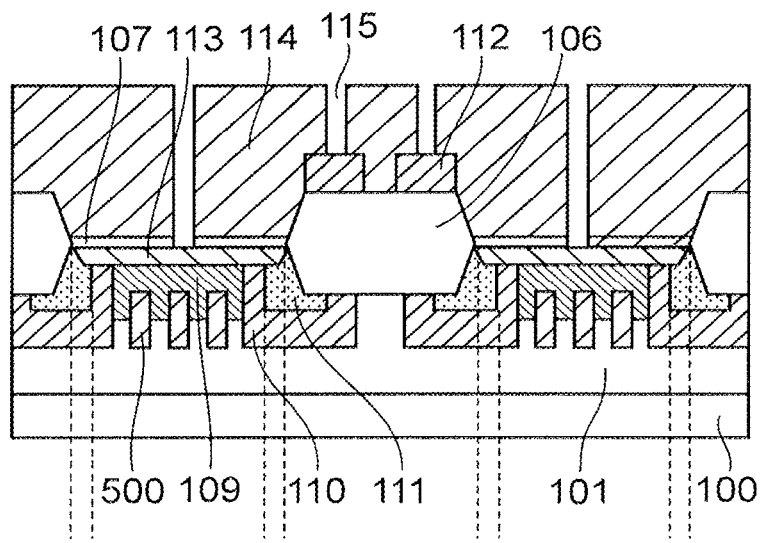
FIGS. 12A, 12B are diagrams showing the manufacturing method of the photo detector including the photo detection element according to the first embodiment.
Figure 12B:
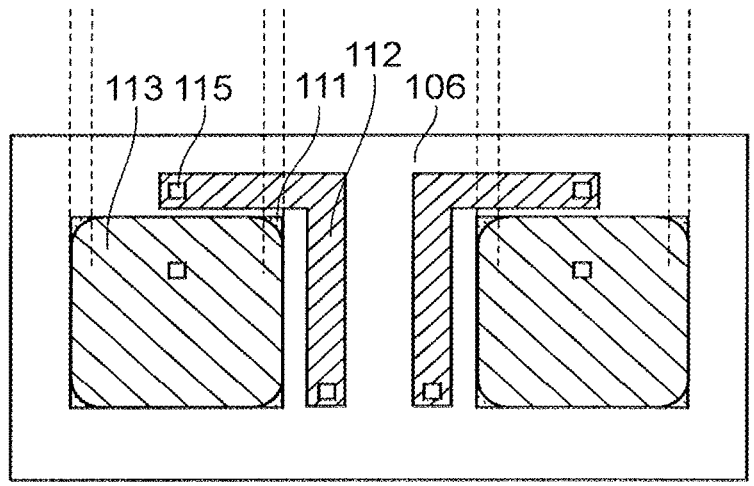

Next, as shown in FIGS. 12A, 12B, the insulating film layer 114 is deposited in a thickness of 0.8 µm by a CVD method, and contact holes 115 are formed on the quench resistor 112 and the n-type layer 113 by a lithography process and an RIE process.

Next, each of the electrodes 116, 200 is deposited by a sputtering method in a thickness of 0.8 µm, for example, and is processed into a prescribed shape by a lithography method and an RIE method. At this time, the electrodes 116, 200 are also embedded respectively into the contact holes 115 to form a contact with the n-type layer 113. Then, a silicon nitride film as the passivation film 117 is deposited in a thickness of 0.3 µm by a CVD method, and a reading pad is opened by an RIE method. Finally, a Ti/Au film is deposited as the electrode 119 on the back surface of the single crystal p-type silicon substrate 100, and thereby the photo detector shown in FIGS. 1A, 1B is manufactured.

By this means, in the photo detection element 1, the first electrode 116 is an anode electrode, and the back surface electrode 119 is a cathode electrode. In FIGS. 1A, 1B, the photo detector including the two photo detection elements 1 is shown, but the number of the photo detection elements 1 is not limited to this. In addition, a plurality of the photo detection elements 1 may be arranged in an array shape to compose a photo detector.

In order to actually operate the photo detector, a negative operating voltage (Vop), that is a bias voltage in the range of not less than −29 V and not more than −20 V, for example, is applied to the back surface electrode 119, and the reading pad is used as the GND potential.

In the photo detection element according to the present embodiment, the sixth regions 500 are provided, and thereby uniformity of the electric field in the avalanche region formed by the pn junction is enhanced. As a result, the photo detection element according to the embodiment improves the photon detection efficiency.

In addition, without being limited to the example of FIGS. 1A, 1B, the p-type guard ring layer 110 and the n-type guard ring layer 111 may be omitted.

Modification

A modification of the first embodiment will be described focusing on the points different from the first embodiment.

Figure 13A:
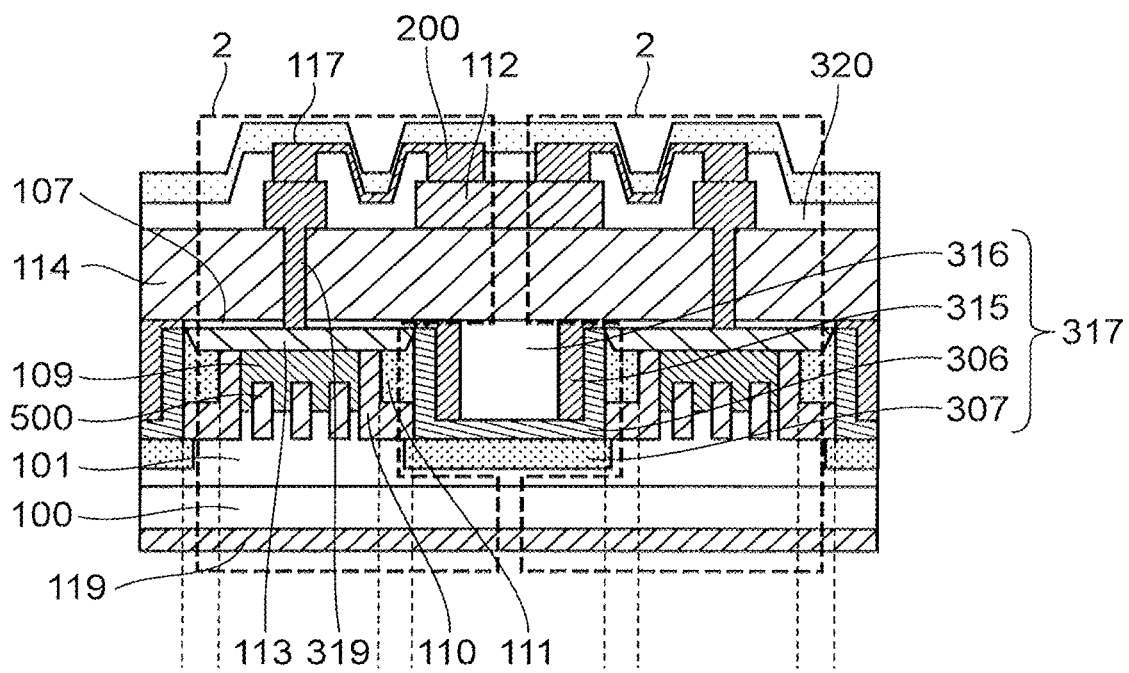
FIGS. 13A, 13B are diagrams showing a photo detector according to a modification of the first embodiment.
Figure 13B:
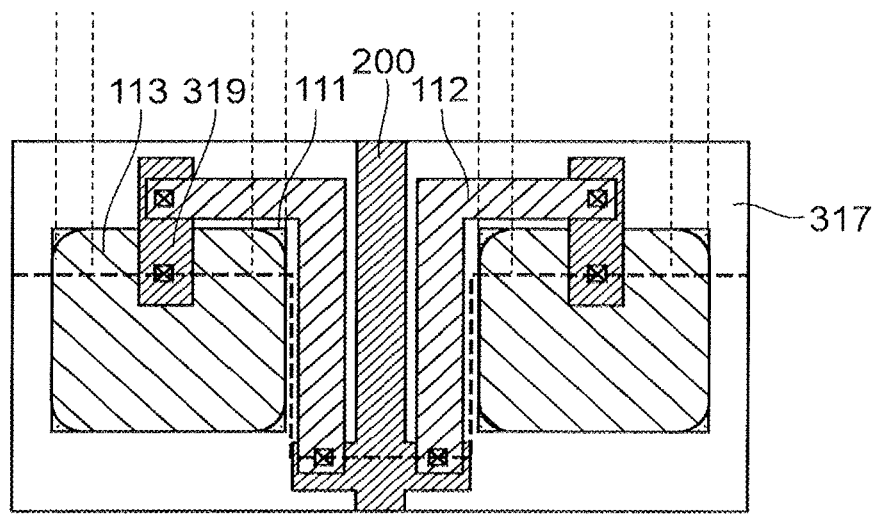

FIGS. 13A, 13B are respectively a sectional view and a top view of a photo detector including a photo detection element 2 according to a modification of the first embodiment. FIG. 13A is a sectional view of a dotted line of FIG. 13B.

As shown in FIGS. 13A, 13b, the photo detector according to the modification of the first embodiment includes a plurality of the photo detection elements 2 according to the modification of the first embodiment, and a trench-type element isolation structure 317 provided among a plurality of the photo detection elements 2.

The photo detection element 2 according to the modification of the first embodiment is further provided with an insulating layer 320 provided so as to cover the insulating layer 114, an aluminum electrode 319, and the electrode 200. In addition, the quench resistor 112 is provided between the insulating layer 320 and the passivation film 117.

The trench-type element isolation structure 317 includes a p-type implantation layer 307, a thermal oxide film 306 provided so as to cover side surfaces of the p-type guard ring layer 110 and the n-type guard ring layer 111 and a surface of the p-type implantation layer 307, a barrier metal 315 provided so as to cover a side surface of the thermal oxide film 306, and an embedded metal 316 made of tungsten which is provided so as to cover a side surface of the barrier metal 315 and the thermal oxide film 306.

The thermal oxide film 306 is provided for improvement of etching damage of the side surface and the bottom surface of the element isolation structure 317, improvement of film depositing property of the barrier metal 315, and a diffusion barrier of titanium composing the barrier metal 315 into Si.

The p-type implantation layer 307 is provided for suppressing defects due to the RIE damage. The p-type implantation layer 307 is formed by ion implantation of boron into the p-type silicon epilayer 101 at a vertical angle.

The embedded metal 316 is provided for reflecting or absorbing secondary photons generated when avalanche is generated in the neighboring photo detection element and thereby for suppressing optical cross talk.

The barrier metal 315 is provided for a diffusion barrier of tungsten composing the embedded metal 316 into Si, and improvement of adhesiveness to the thermal oxide film 306.

Next, a manufacturing method of the photo detector according to the modification of the first embodiment will be described.

Figure 14A:
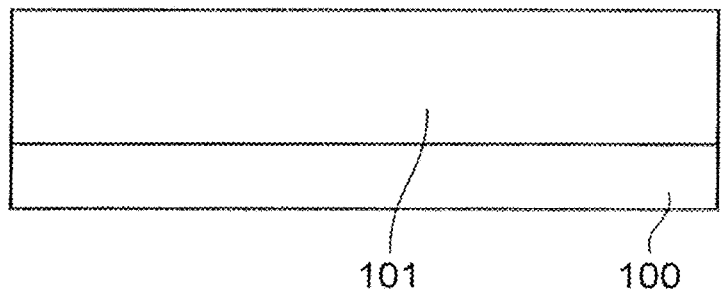
FIGS. 14A, 14B are diagrams showing a manufacturing method of the photo detector including the photo detection element according to the modification of the first embodiment.
Figure 14B:
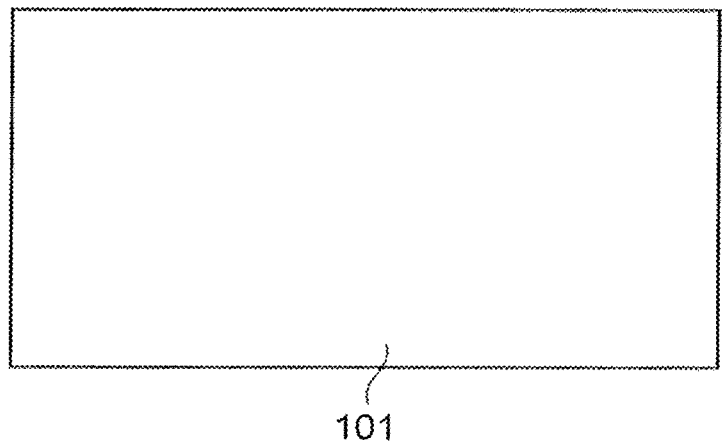

In the photo detection element 2 according to the modification of the first embodiment, as shown in FIGS. 14A, 14B, a wafer is prepared in which the p-type silicon epilayer 101 doped with boron at a concentration of 1E15/cm³ ($1.0 \times 10^{15}$/cm³) is epitaxially grown in a thickness of 10 µm, on the single crystal p-type silicon substrate 100 doped with boron at a concentration of 4E18/cm³ ($4.0 \times 10^{18}$/cm³).

Figure 15A:
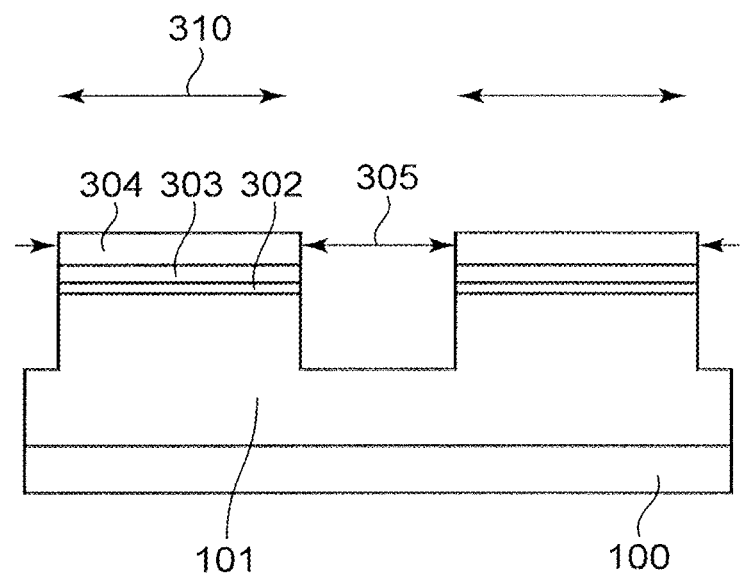
FIGS. 15A, 15B are diagrams showing the manufacturing method of the photo detector including the photo detection element according to the modification of the first embodiment.
Figure 15B:
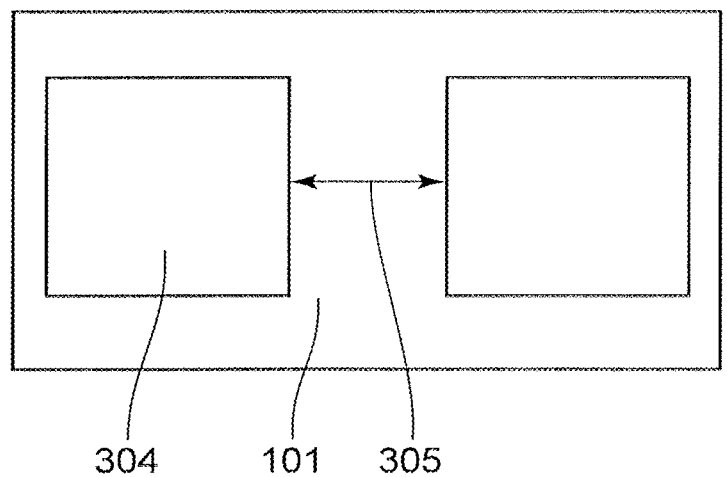

Next, as shown in FIGS. 15A, 15B, a surface of the p-type silicon epilayer 301 is oxidized to deposit a silicon oxide film 302 of a thickness of 10 nm, and then a silicon nitride film 303 and a silicon oxide film 304 are deposited by a Low-Pressure CVD in thicknesses of 150 nm and 150 nm, respectively, for example. Then a resist to define an element isolation region 305 of a width of 1 µm is pattern-formed by a lithography process, and the silicon oxide film 304, the silicon nitride film 303 and the silicon oxide film 302 at a resist opening portion are removed by an RIE method. Then, the p-type silicon epilayer 101 is etched by 8 µm by an RIE method using the silicon oxide film 304, the silicon nitride film 303, and the silicon oxide film 302 as a mask, to form a trench groove in the element isolation region 305.

Figure 16A:
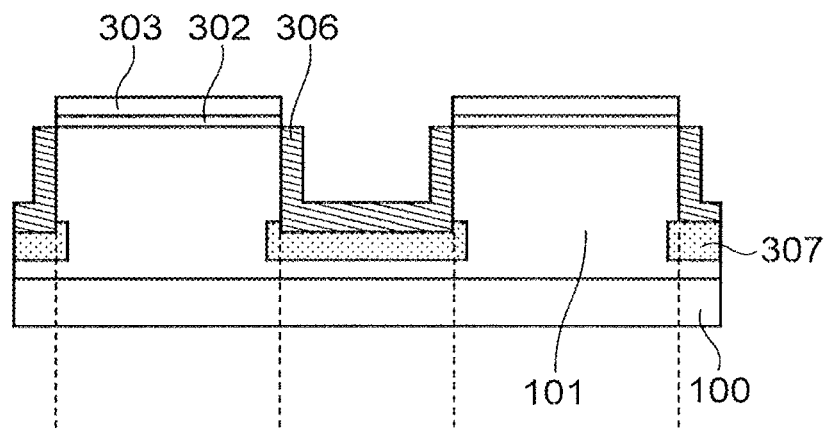
FIGS. 16A, 16B are diagrams showing the manufacturing method of the photo detector including the photo detection element according to the modification of the first embodiment.
Figure 16B:
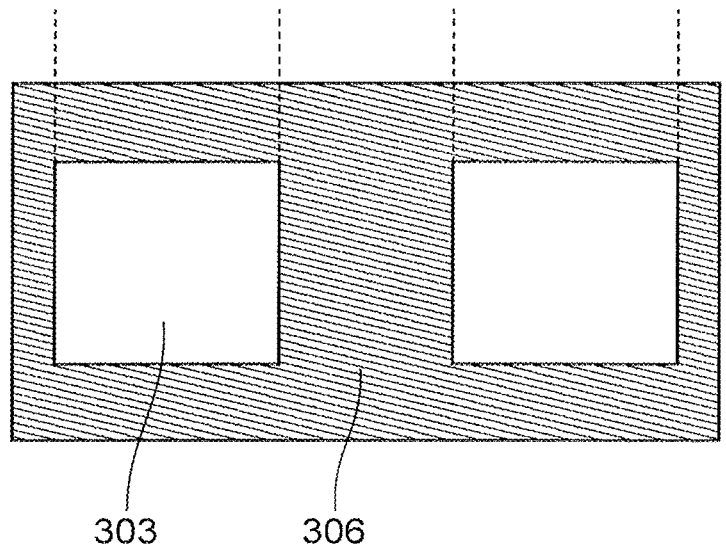

Next, as shown in FIGS. 16A, 16B, the silicon oxide film 304 is removed by a hydrofluoric acid solution, and the thermal oxide film 306 with a thickness of 50 nm is deposited on a surface of the silicon layer by thermal oxidation. Then, the p-type implantation layer 307 is formed in the vicinity of the trench groove bottom portion by ion implantation of boron into the p-type silicon epilayer 101 at a vertical angle, and is activated by an annealing processing at 1000° C. for 30 minutes. The p-type implantation layer 307 may be omitted.

Figure 17A:
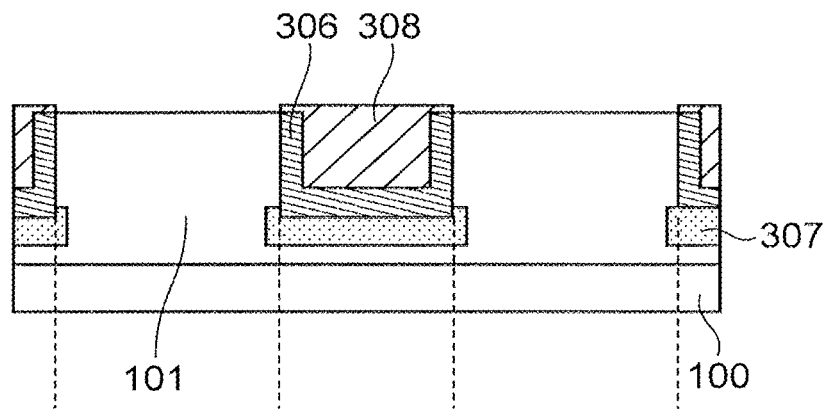
FIGS. 17A, 17B are diagrams showing the manufacturing method of the photo detector including the photo detection element according to the modification of the first embodiment.
Figure 17B:
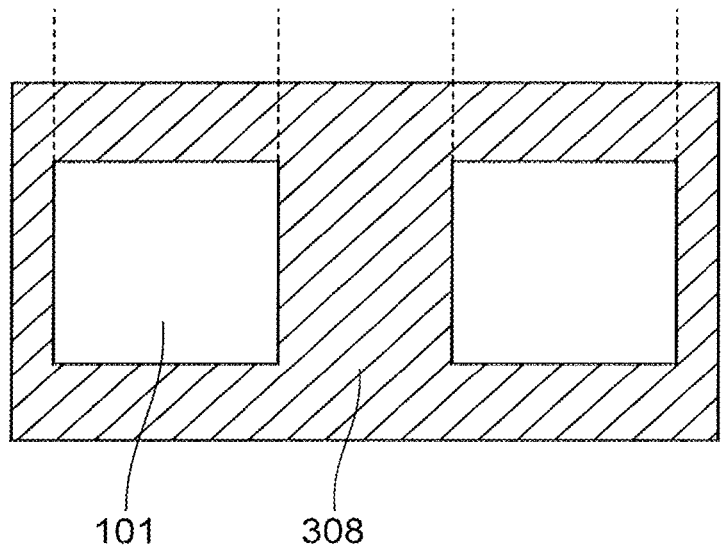

Next, as shown in FIGS. 17A, 17B, for example, an embedded silicon oxide film 308 is deposited in a thickness of 0.6 µm by a CVD method, and is planarized by an insulating film CMP method. By this means, the trench-type element isolation structure 317 is formed. Then, the silicon nitride film 303 and the silicon oxide film 302 are removed by a thermal phosphoric acid processing and a hydrofluoric acid processing, respectively.

The silicon oxide film 107, the p-type layer 109, the p-type guard ring layer 110, the sixth regions 500, the n-type guard ring layer 111, and the n-type layer 113 doubling as the ohmic electrode portion of the metal electrode and the silicon layer are respectively deposited in an element region 310 shown in FIG. 15 by the same lithography process and the same ion implantation process as in the first embodiment.

Figure 18A:
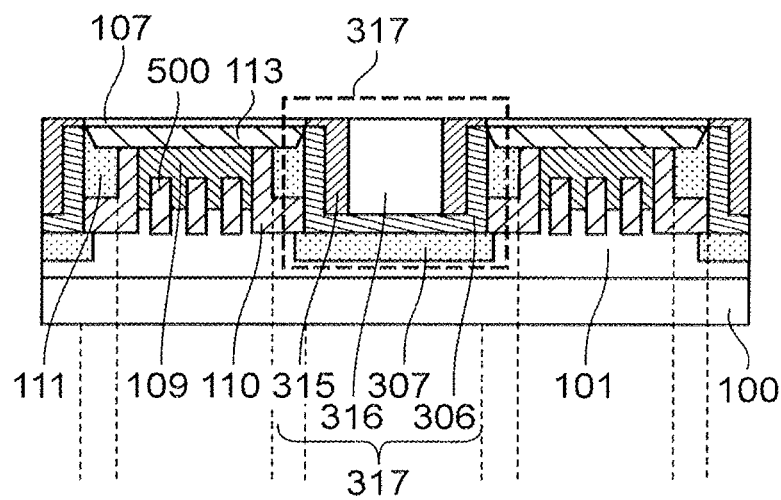
FIGS. 18A, 18B are diagrams showing the manufacturing method of the photo detector including the photo detection element according to the modification of the first embodiment.
Figure 18B:
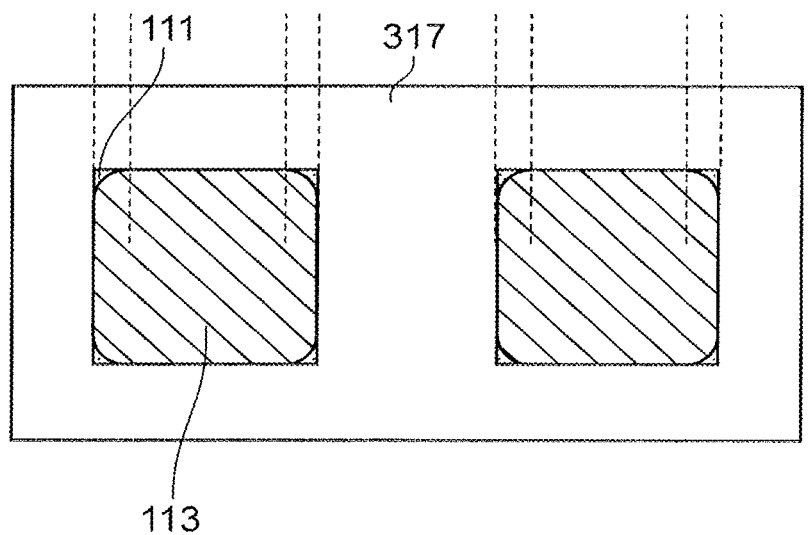

Next, as shown in FIGS. 18A, 18B, a resist pattern of a shape surrounding the element region 310 with a width of 0.8 µm is deposited in the element isolation region 305 by a lithography process, and the embedded silicon oxide film 308 is removed by an RIE method. Then, titanium and titanium nitride are deposited as the barrier metal 315 in thicknesses of 50 nm and 10 nm by sputtering methods, respectively. Next, tungsten is deposited in a thickness of 0.22 µm by a CVD method, and is planarized by a CMP method. By this means, the trench-type element isolation structure 317 is formed.

Figure 19A:
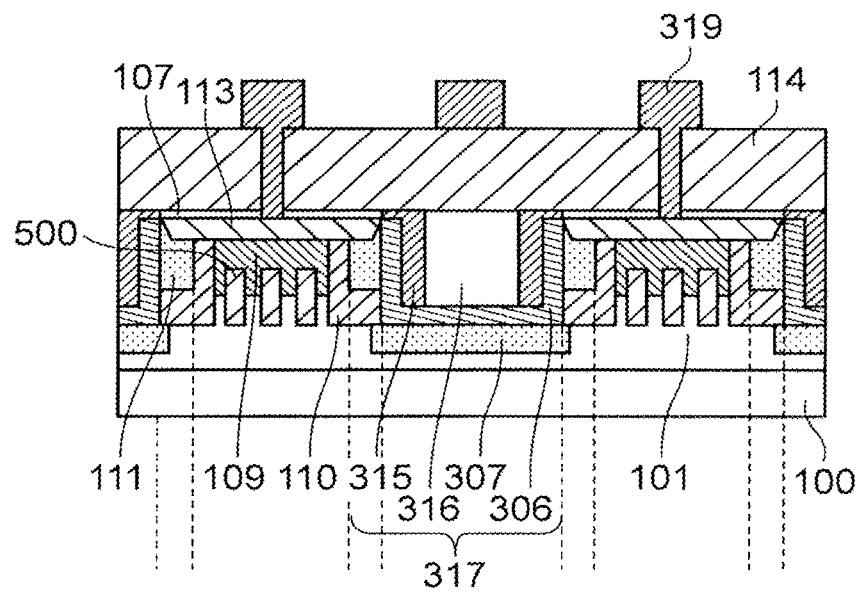
FIGS. 19A, 19B are diagrams showing the manufacturing method of the photo detector including the photo detection element according to the modification of the first embodiment.
Figure 19B:
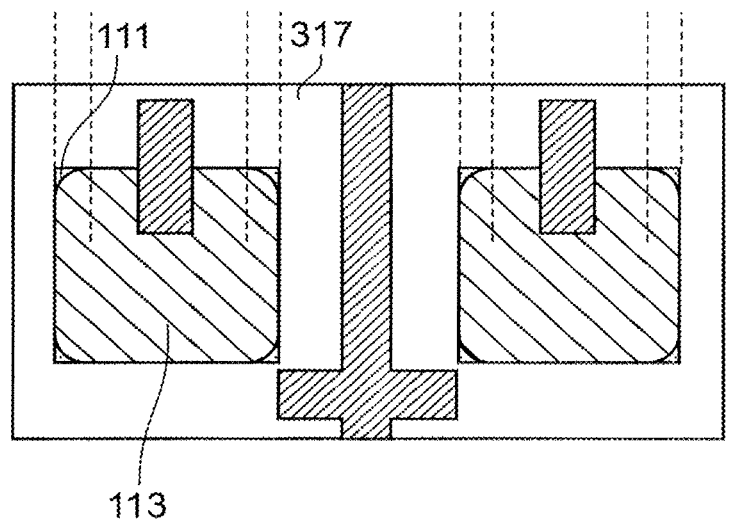

Next, as shown in FIGS. 19A, 19B, the insulating film layer 114 is deposited in a thickness of 0.8 µm by a CVD method, and a contact hole is formed on the n-type layer 113 by a lithography process and an RIE process. Then, the aluminum electrode 319 is deposited in a thickness of 0.8 µm by a sputtering method, for example, and is processed into a prescribed shape by a lithography method and an RIE method. At this time, the aluminum electrode 319 is also embedded into the contact hole to form an ohmic contact with the n-type layer 113.

Next, the insulating layer 320 is deposited in a thickness of 0.8 µm by a CVD method, and a via hole is formed on the aluminum electrode 319 by a lithography process and an RIE process. Then, the quench resistor 112 is deposited by a sputtering method, and is processed into a prescribed shape by a lithography method and an RIE method. A material of the quench resistor 112 is preferably SiCr and its nitride film, Ti and its nitride film, or a laminated structure thereof, and though a film thickness thereof is different depending on the specification of the device property, it is approximately in a range of not less than 5 nm and not more than 50 nm. Then, a silicon nitride film is deposited as the passivation film 117 in a thickness of 0.3 µm by a CVD method, and a reading pad is opened by an RIE method. Finally, a Ti/Au film is deposited as the back surface electrode 119 on the back surface of the single crystal p-type silicon substrate 100, and thereby the photo detector shown in FIGS. 13A, 13B is manufactured. In addition, the groove formed on the passivation film 117 is a groove formed at the time of manufacturing, and may be embedded with an insulating material.

The photo detector according to the modification of the first embodiment further separates the path of the carriers from the vicinity of the damage at the time of forming the element isolation structure, and thereby can suppress an afterpulse resulting from a defect more than the first embodiment, in addition to the same effect as the first embodiment.

Second Embodiment

Figure 20:
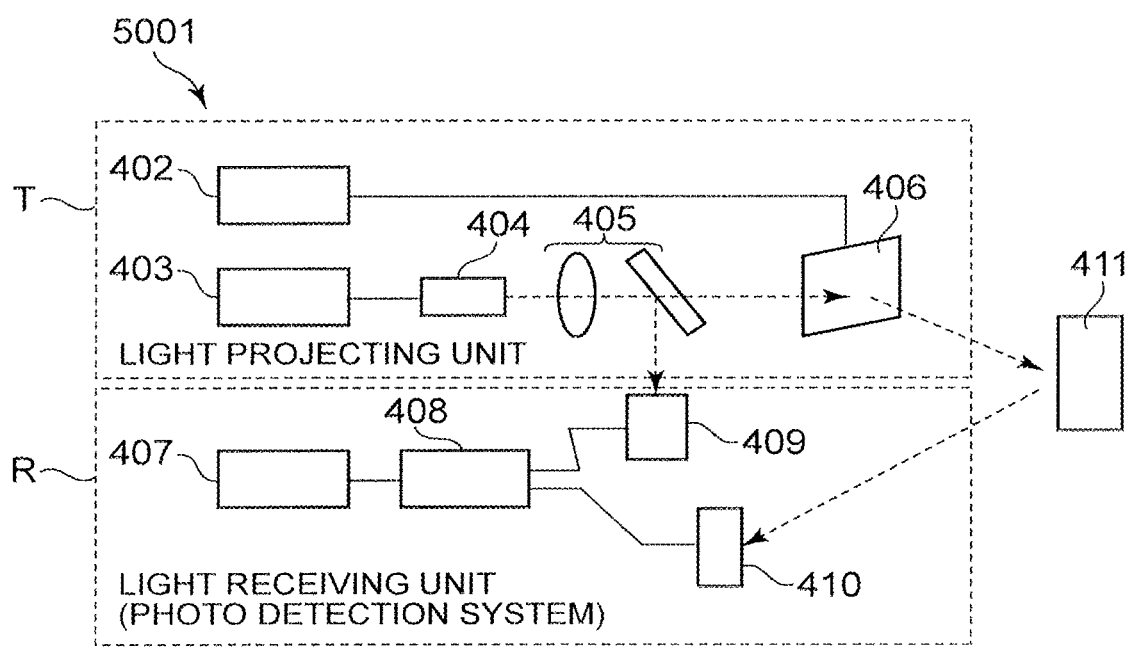
FIG. 20 is a diagram showing a lidar device according to a second embodiment.

FIG. 20 shows a lidar (Laser Imaging Detection and Ranging: LIDAR) device 5001 according to a second embodiment.

This embodiment is composed of a line light source and a lens, and can be applied to a long distance photographing subject detection system (LIDAR), and so on. The lidar device 5001 is provided with a light projecting unit T to project laser light to an object 411, and a light receiving unit R (also called a photo detection system) which receives the laser light from the object 411, measures a time required for the laser light to reciprocate to the object 411, and converts the time into a distance.

In the light projecting unit T, a laser light oscillator (also called a light source) 404 oscillates laser light. A drive circuit 403 drives the laser light oscillator 404. An optical system 405 extracts a part of the laser light as reference light, and irradiates the object 411 with the other laser light via a mirror 406. A mirror controller 402 controls the mirror 406 to project the laser light to the object 411. Here, light projecting means to project light.

In the light receiving unit R, a reference light detector 409 detects the reference light extracted by the optical system 405. A photo detector 410 receives reflected light from the object 411. A distance measuring circuit 408 measures a distance to the object 411, based on the reference light detected by the reference light detector 409 and the reflected light detected by the photo detector 410. An image recognition system 407 recognizes the object 411, based on the result measured by the distance measuring circuit 408.

The lidar device 5001 employs a light flight time ranging method (Time of Flight) which measures a time required for laser light to reciprocate to the object 411 and converts the time into a distance. The lidar device 5001 is applied to an on-vehicle drive-assist system, remote sensing, and so on. When any one of the photo detectors of the above-described embodiment and modification is used as the photo detector 410, the lidar device 5001 expresses good sensitivity particularly in a near infra-red region. For this reason, it becomes possible to apply the lidar device 5001 to a light source in a human-invisible wavelength band. The lidar device 5001 can be used for obstacle detection for vehicle, for example.

Figure 21:
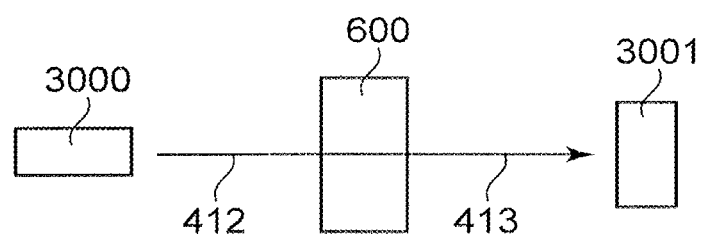
FIG. 21 is a diagram for describing detection by the lidar device according to the second embodiment.

FIG. 21 is a diagram for describing detection of a detection object by the lidar device.

A light source 3000 emits a light 412 to an object 600 as a detection object. A photo detector 3001 detects a light 413 which is transmitted through the object 600, or reflected and diffused from the object 600.

When the photo detector 3001 uses any one of the photo detectors according to the above-described present embodiment and the modification, for example, it realizes high-sensitivity detection.

Figure 22:
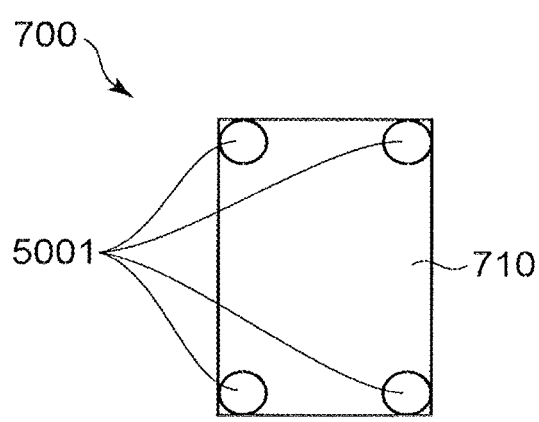
FIG. 22 is a schematic top view of a vehicle provided with the lidar devices according to the second embodiment.

In addition, it is preferable that a plurality of sets of the photo detector 410 and the light source 404 are provided, and the arrangement relation thereof is previously set to software (can be replaced by a circuit). It is preferable that regarding the arrangement relation of the sets of the photo detector 410 and the light source 404, the sets are provided at an equal interval. By this means, the output signals of the respective photo detectors 410 are complemented with each other, and thereby an accurate three-dimensional image can be generated. FIG. 22 is a schematic top view of a vehicle provided with the lidar devices according to the second embodiment.

A vehicle 700 according to the present embodiment is provided with the lidar devices 5001 at the four corners of a vehicle body 710, respectively.

The vehicle according to the present embodiment is provided with the lidar devices at the four corners of the vehicle body, respectively, and accordingly it can detect environment in the whole directions of the vehicle by the lidar devices.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A photo detection element comprising:
a first region of a first conductivity type;
a second region of a second conductivity type;
a third region of the first conductivity type provided between the second region and the first region; and
a plurality of structure bodies of the first conductivity type which are provided between the first region and the second region separately in a second direction crossing with a first direction from the third region toward the second region.

2. The photo detection element according to claim 1, wherein:
the structure bodies are provided between the first region and the third region.

3. The photo detection element according to claim 1, wherein:
the structure bodies are provided separately in the second direction at intervals of the same level.

4. The photo detection element according to claim 3, wherein:
a clearance between the structure bodies is not more than 30% of a width of the photo detection element in the second direction.

5. The photo detection element according to claim 4, further comprising:
a fourth region of the second conductivity type provided so as to surround a periphery of the second region in the second direction; and
a fifth region of the first conductivity type provided between the first region and the fourth region.

6. The photo detection element according to claim 5, wherein:
a depth of peak impurity concentration of the fifth region in the first direction is the same level as a depth of peak impurity concentration of the structure body.

7. The photo detection element according to claim 6, wherein:
a peak impurity concentration of the fifth region is the same level as a peak impurity concentration of the structure body.

8. The photo detection element according to claim 7, wherein:
at least a part of the fifth region is provided between the third region and the fourth region.

9. The photo detection element according to claim 8, wherein:
the depth of peak impurity concentration of the fifth region in the first direction is deeper than a depth of peak impurity concentration of the third region.

10. The photo detection element according to claim 9, wherein:
the peak impurity concentration of the fifth region is higher than a peak impurity concentration of the third region.

11. The photo detection element according to claim 10, wherein:
the fourth region covers at least a part of an edge of the second region.

12. The photo detection element according to claim 11, wherein:
a peak impurity concentration of the fourth region is lower than a peak impurity concentration of the second region.

13. The photo detection element according to claim 12, wherein:
at least one of the second region, the third region, the fourth region, the fifth region and the structure body has a curvature at each of four corners seen from a light incident direction.

14. The photo detection element according to claim 13, wherein:
a pn junction diode is formed between the second region and the third region.

15. The photo detection element according to claim 14, further comprising:
an electrode to apply a reverse bias not less than a breakdown voltage to the photo detection element.

16. A photo detector comprising:
at least two or more photo detection elements; and
an element isolation structure provided among the photo detection elements;
the photo detection element including
a first region of a first conductivity type,
a second region of a second conductivity type,
a third region of the first conductivity type provided between the second region and the first region, and
a plurality of structure bodies of the first conductivity type which are provided between the first region and the third region separately in a second direction crossing with a first direction from the third region toward the second region.

17. The photo detector according to claim 16, wherein:
the photo detection element includes a fourth region of the second conductivity type provided so as to surround a periphery of the second region in the second direction; and the fourth region covers at least a part of the element isolation structure.

18. The photo detector according to claim 17, wherein:
the fourth region has a depth of peak impurity concentration which is the same level as or deeper than the element isolation structure.

19. A photo detection system comprising:
a photo detector; and
a distance measuring circuit to calculate a light flight time from an output signal of the photo detector;
the photo detector including
at least two or more photo detection elements, and
an element isolation structure provided among the photo detection elements;
the photo detection element including
a first region of a first conductivity type,
a second region of a second conductivity type,
a third region of the first conductivity type provided between the second region and the first region, and
a plurality of structure bodies of the first conductivity type which are provided between the first region and the third region separately in a second direction crossing with a first direction from the third region toward the second region.

20. A lidar device comprising:
a light source to irradiate an object with light; and
a photo detection system to detect a light reflected from the object;
the photo detection system including
a photo detector, and
a distance measuring circuit to calculate a light flight time from an output signal of the photo detector;
the photo detector including
at least two or more photo detection elements, and
an element isolation structure provided among the photo detection elements;
the photo detection element including
a first region of a first conductivity type,
a second region of a second conductivity type,
a third region of the first conductivity type provided between the second region and the first region, and
a plurality of structure bodies of the first conductivity type which are provided between the first region and the third region separately in a second direction crossing with a first direction from the third region toward the second region.

21. The lidar device according to claim 20 further comprising:
an image recognition system to generate a three-dimensional image based on arrangement relation of the light source and the photo detector.

22. A vehicle comprising:
four lidar devices provided at respective four corners of a vehicle body;
the lidar device including
a light source to irradiate an object with light, and
a photo detection system to detect a light reflected from the object;
the photo detection system including
a photo detector, and
a distance measuring circuit to calculate a light flight time from an output signal of the photo detector;
the photo detector including
at least two or more photo detection elements, and
an element isolation structure provided among the photo detection elements;
the photo detection element including
a first region of a first conductivity type,
a second region of a second conductivity type,
a third region of the first conductivity type provided between the second region and the first region, and
a plurality of structure bodies of the first conductivity type which are provided between the first region and the third region separately in a second direction crossing with a first direction from the third region toward the second region.

* * * * *